(12) United States Patent
Perregaux

(10) Patent No.: US 6,610,972 B2
(45) Date of Patent: Aug. 26, 2003

(54) SYSTEM FOR COMPENSATING FOR CHIP-TO-CHIP GAP WIDTHS IN A MULTI-CHIP PHOTOSENSITIVE SCANNING ARRAY

(75) Inventor: Alain E. Perregaux, Rochester, NY (US)

(73) Assignee: Xerox Corporation, Stamford, CT (US)

(*) Notice: Subject to any disclaimer, the term of this patent is extended or adjusted under 35 U.S.C. 154(b) by 225 days.

(21) Appl. No.: 09/892,823

(22) Filed: Jun. 27, 2001

(65) Prior Publication Data

US 2003/0001077 A1 Jan. 2, 2003

(51) Int. Cl.[7] ............................................. H01J 40/14
(52) U.S. Cl. ...................................... 250/208.1; 438/66
(58) Field of Search .......................... 250/208.1, 214 R, 250/216, 239; 438/21, 63, 66, 67; 257/431, 443

(56) References Cited

U.S. PATENT DOCUMENTS 5,153,421 A * 10/1992 Tandon et al. ............ 250/208.1
5,510,273 A * 4/1996 Quinn ........................... 438/21
5,552,828 A   9/1996 Perregaux .................... 348/315

FOREIGN PATENT DOCUMENTS

| JP | 09-321948 A | 5/1996 |
| JP | 10-126584 A | 10/1996 |
| JP | 2000-196835 | 7/2000 |
| JP | 2000-199702 | 7/2000 |

* cited by examiner

Primary Examiner—Kevin Pyo
(74) Attorney, Agent, or Firm—R. Hutter

(57) ABSTRACT

In a photosensitive scanning apparatus, in which a plurality of chips are aligned to form a single linear array of photosensors, gaps of unknown width between photosensors on adjacent chips may have an effect on resulting image quality. A set of simple strategies can be used to overcome the problem. In a first strategy, for each chip, interpolation of output values of the photosensors is used to in effect displace the outputs of the photosensors by a predetermined amount toward a gap; within constraints, the predetermined displacement can be used without actual measurement of any gap width. In a second strategy, an interpolated output of a theoretical "phantom photosensor" disposed toward the gap is added to the output stream from each chip.

5 Claims, 2 Drawing Sheets

SYSTEM FOR COMPENSATING FOR CHIP-TO-CHIP GAP WIDTHS IN A MULTI-CHIP PHOTOSENSITIVE SCANNING ARRAY

FIELD OF THE INVENTION

The present invention relates generally to an imaging apparatus in which a plurality of photosensitive chips are mounted on a substrate. In particular, the present invention relates to a signal processing method which addresses uneven chip-to-chip gaps in such an apparatus.

BACKGROUND OF THE INVENTION

Image sensors for scanning document images, such as charge coupled devices (CCDs), typically have a row or linear array of photosensors together with suitable supporting circuitry integrated onto a silicon chip. Usually, a sensor is used to scan line by line across the width of a document with the document being moved or stepped lengthwise in synchronism therewith. A typical architecture for such a sensor array is given, for example, in U.S. Pat. No. 5,153,421.

In one design of a full-page-width image scanner, there is provided a linear array of small photosensors which extends the full width of an original document, such as 11 inches. These photosensors may be spaced as finely as 600 to the inch on each chip. When the original document moves past the linear array, each of the photosensors converts reflected light from the original image into electrical signals. The motion of the original image perpendicular to the linear array causes a sequence of signals to be output from each photosensor, which can be converted into digital data.

A currently-preferred design for creating such a long linear array of photosensors is to provide a set of relatively small semiconductor chips, each semiconductor chip defining thereon a linear array of photosensors along with ancillary circuit devices. These chips are typically approximately ¾ inches in length; in order to create a practical full-page-width array, as many as twenty or more of these chips can be placed end-to-end to form a single linear array of photosensors. The chips are typically mounted on a support platform. This support platform also includes circuitry, such as on a printed wiring board, which accesses the circuit devices on the individual chips for a practical system. The interconnections between the relatively large-scale conductors on the printed wiring board and the relatively small contact pads on the semiconductor chips are preferably created by wire bonds which are ultrasonically welded to both the printed wiring board conductors and to contact pads on the chips.

When the chips are mounted within an imaging apparatus, such as a document scanner, the imperfections of each chip combine with the imperfections of the mounting process to yield an overall problem of unpredictably-sized gaps between each adjacent pair of chips in the array, and more specifically, unpredictably-sized gaps between neighboring photosensors on neighboring chips. As the chip collectively form one or more continuous linear arrays of photosensors when assembled, the presence of a plurality of gaps in the linear array will have profound effects on the quality of images recorded with the scanner. Various techniques have been proposed in the prior art, such as described in detail below, to take into account these unpredictably-sized gaps as they effect the regularity of spacing of photosensors along a complete linear array. These techniques largely comprise taking actual measurements of the gap between each pair of chips (such as by recording a test pattern, for example), retaining the calculated measurements of each gap, and then, when the scanner is used for recording images, compensating for each specific gap width using, for instance, an interpolation technique based on the readings from photosensors adjacent each gap.

The present invention is directed to a method of compensating for unpredictably-sized gaps along a linear array of photosensors, which uses a simple algorithm and does not require either testing of, or retention of specific information about, individual gaps along the array.

DESCRIPTION OF THE PRIOR ART

U.S. Pat. No. 5,552,828 discloses a page-width linear array comprising a plurality of chips. Imprecisions associated with inter-chip gaps are remedied by providing end photosensors with trapezoidal or near-trapezoidal geometries.

Japanese publication JP 09-321948-A discloses a maintenance method for a scanner in which the sizes of inter-chip gaps in a scanner are measured by scanning an image of a perfect circle and analyzing the resulting image.

Japanese publication JP 10-126584-A discloses a maintenance method for a scanner in which the sizes of inter-chip gaps in a scanner are measured by scanning an image of a series of angled lines and analyzing the resulting image.

Japanese publication JP 2000-196835-A discloses an operating method for a scanner in which the sizes of specific inter-chip gaps in a scanner are retained in memory, and subsequent image signals are interpolated based on the retained gap sizes.

Japanese publication JP 2000-199702-A discloses a maintenance method for a scanner in which the sizes of inter-chip gaps in a scanner are measured by scanning an image of a series of lines and analyzing the resulting image.

SUMMARY OF THE INVENTION

According to one aspect of the invention, there is provided a method of processing image data from a photosensitive imaging apparatus, the apparatus including a plurality of chips, each chip having a linear array of photosensors thereon, the photosensors on each chip being spaced by a predetermined pitch, each photosensor adapted to output a value related to light incident thereon, the chips being mounted with the linear arrays thereon arranged to form a main linear array, each pair of chips in the plurality of chips defining a gap therebetween. For a chip, the outputs of the photosensors therein are interpolated to effect a spatial displacement of the outputs along the main linear array. The displacement is a product of a constant and an integer, the integer relating to a position of the chip along the main linear array.

According to another aspect of the invention, there is provided a method of processing image data from a photosensitive imaging apparatus, the apparatus including a plurality of chips, each chip having a linear array of photosensors thereon including an end photosensor, the photosensors on each chip being spaced by a predetermined pitch, each photosensor adapted to output a value related to light incident thereon, the chips being mounted with the linear arrays thereon arranged to form a main linear array, each pair of chips in the plurality of chips defining a gap therebetween. For a chip, an output is interpolated of a phantom photosensor disposed a predetermined distance from an end photosensor toward the gap, thereby yielding an artificial value. The artificial value is added to a data stream output from the chip.

DETAILED DESCRIPTION OF THE INVENTION

Figure 1:
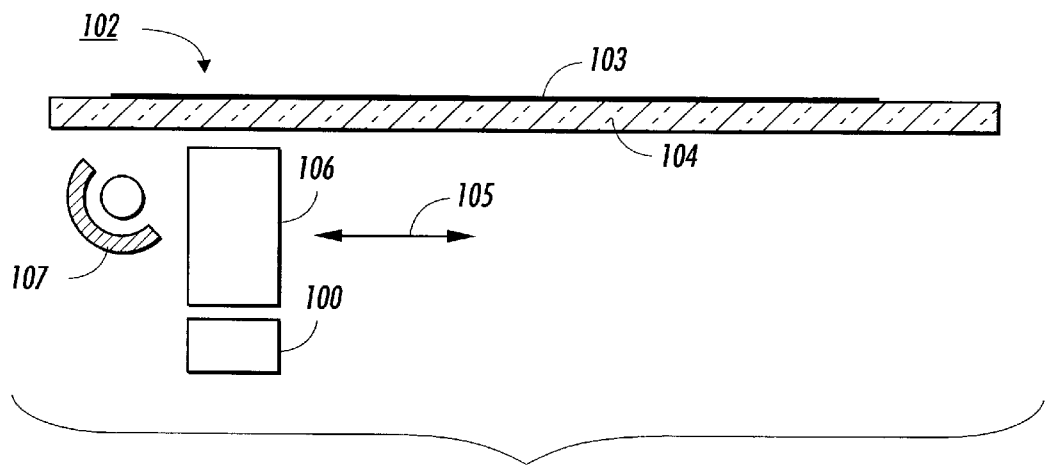
FIG. 1 is an elevational view showing an exemplary raster input scanner of the type adapted to use a scanning array, or sensor bar, used with the present invention.

Referring to FIG. 1, there is shown an exemplary raster input scanner of the type adapted to use a scanning array, or sensor bar, 100. Sensor bar 100 comprises a linear full width array having a scan width in the fast scan direction substantially equal to or slightly greater than the width of the largest document 103 or other object to be scanned. Documents to be scanned are supported on a generally rectangular transparent platen 104, typically glass, sized to accommodate the largest original document 103 to be scanned. A document 103 to be scanned is located either manually or by a suitable automatic document handler or feeder (not shown) on platen 104 for scanning. Array 100 is supported for reciprocating scanning movement in the scan direction depicted by arrows 105 below platen 104 by a movable scanning carriage (not shown). A lens 106 focuses array 100 on a line-like area extending across the width of platen 104. One or more lamp and reflector assemblies forming a light source 107 are provided for illuminating the line-like area on which array 100 is focused.

Figure 2:
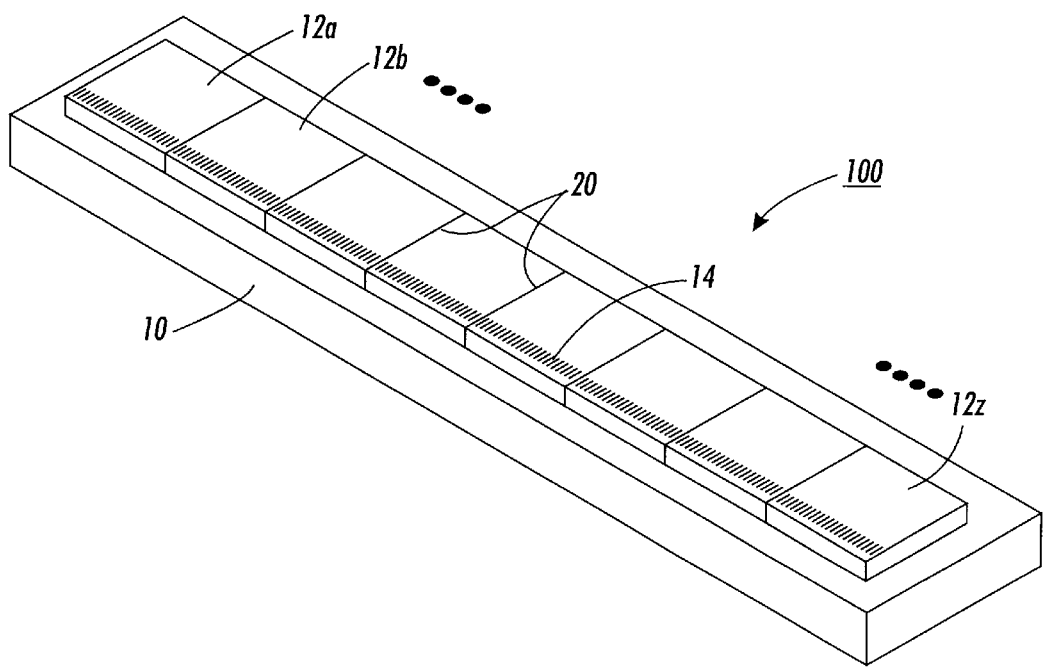
FIG. 2 is a perspective view showing the essential portions of an imaging scanner array used with the present invention.

FIG. 2 shows the essential portions of an imaging scanner array 100, in which a substrate 10 has a plurality of silicon chips 12a, 12b, . . . 12z assembled end-to-end and mounted thereon. Also defined on each chip 12a, 12b, . . . 12z is a set of photosensors 14. These structures may be, by way of example and not limitation, photosensors in a CCD, photogates, or CMOS photodiodes.

The most common primary material for chips 12a–12z is crystalline silicon. A preferred substance for forming substrate 100 is the board sold under the tradename CERACOM, made by Ibiden Corporation of Japan, which generally comprises a ceramic core with a fiberglass resin laminate thereon. Another material suitable for substrate 100 includes the printed wire board material known as "FR-4," or a relatively thin substrate of alumina.

On each chip 12 there is provided a large number (such as 250 or more) photosensors 14, which are separated by a largely consistent pitch, a pitch being defined as the distance between the centers of adjacent photosensors within a chip. In the basic chip 12, each of the photosensors 14 are separated through the centers thereof by (in the example of a 600 spi scanner) 42.3 micrometers throughout the entire length of the chip 12, with the end photosensors in the linear array being ideally spaced from the edge of the chip by one-half of the pitch, or 21.15 micrometers. This arrangement of photosensors 14 will generally maintain an even pitch spacing even when a plurality of chips 12 are assembled end-to-end together to form a full-width main array: ideally, the short pitches at the end photosensors will add up to the same pitch relative to end photosensors of adjacent chips.

When the chips 12 are assembled into a scanner, the linear array on each chip 12 combines with the others to form a single linear array, which is in the claims called a "main" linear array. (Although the illustrated embodiment shows chips 12 each with a single linear array of photosensors, the claimed invention can apply to apparatus in which there exist multiple linear arrays of photosensors on each chip, such as in a full-color scanner in which each linear array includes a filter for a particular primary color, or in a two-dimensional imaging scanner.) In such a scanner, there will of course be a gap, here indicated as 20 in FIG. 2, between each adjacent pair of chips 12. As mentioned above, not only will there be an uncertainty in the effective length (along array of photosensors 14) of each chip 12, further uncertainty will result from imprecisions in the assembly process. The effect of these uncertainties in both chip size and placement is that the exact size of any particular gap 20 within a single apparatus, or among a large number of arrays in a manufacturing process, is somewhat variable.

Moreover, the size of any particular gap 20 within a scanner will have a significant effect on the quality of images recorded with the scanner, in that a gap 20 between adjacent chips 12 is also a gap between adjacent photosensors along the main linear array, and by extension the width of any particular gap 20 will have an effect on the relative position of any photosensor 14 on one chip 12 relative to any photosensor on a neighboring chip 12.

For this reason, the prior art is replete with techniques to overcome the image-recording difficulties brought about by imprecisions in the sizes of gaps 20. As mentioned above, these techniques largely comprise taking actual measurements of the gap 20 between each pair of chips (such as by recording a test pattern, for example), retaining the calculated measurements of each gap, and then, when the scanner is used for recording images, compensating for each specific gap width using, for instance, an interpolation technique based on the readings from photosensors adjacent each gap. Such an interpolation technique basically involves taking a weighted average of the outputs from adjacent photosensors to obtain an interpolated output from a predetermined location between the adjacent photosensors. The interpolation technique can be made to result in effecting a spatial displacement of the outputs of the photosensors along the main linear array. (Other, more sophisticated variations of the weighted-average interpolation technique, such as taking a weighted average of outputs of three or more photosensors on either side of a gap 20, and/or using more sophisticated algorithms to effect the interpolation, are known in the art and possibly applicable to the present invention; for purposes of the claims below "interpolation" shall refer to any method by which the interpolated output from a predetermined location is inferred at least in part from the output of any real photosensor in a predetermined physical relation to the predetermined location.)

The present invention addresses the unpredictable-gap problem by use of a simple method which compensates for all widths of a gap 20 within a practical range, and which does not require a scanning system to measure or memorize the actual width of any particular gap in a scanner.

Figure 3:
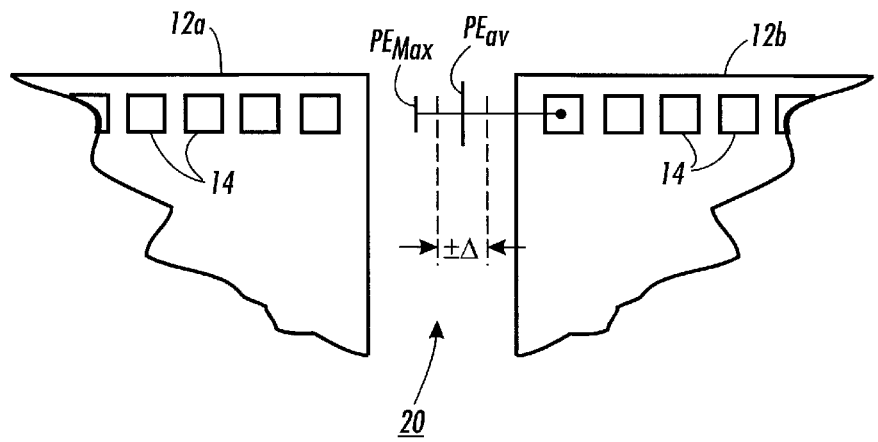
FIG. 3 is a plan view of a typical gap between two adjacent chips illustrating the basic technique of the present invention.

FIG. 3 is a plan view of a typical gap 20 between two adjacent chips 12a, 12b, illustrating the basic technique of the present invention. The pitch, or standard distance between centers of adjacent photosensors 14 within a single chip, is 42.3 micrometers for a 600 spi system. Of course, the adjacent photosensors 14 on either side of gap 20 are not separated by this regular pitch but rather by an unpredictable, unknown pitch.

For purposes of explaining the present invention, the term "pitch error" is defined as a difference between an ideal pitch between adjacent photosensors (42.3 micrometers, in this case) and the actual center-to-center distance between the end photosensors of adjacent chips. Examples of pitch error PE of various types, as will be described below, are shown in gap 20 in FIG. 3; the Figure is intended only to show the physical manifestation of such pitch errors relative to an end photosensor 14 in chip 12*b*, and the illustrated scale of any such pitch error PE relative to the gap 20 or photosensors 14 is not intended to be accurate for any particular embodiment of the invention.

The method of the present invention proceeds on the insight that, given certain fixed parameters of a scanning system, such as a basic resolution and signal-to-noise ratio, there can be identified or estimated a maximum pitch error, here called $PE_{max}$, less than which any corresponding image defects will remain invisible in recorded images made with the apparatus: the errors in image quality caused by specific gaps 20 will simply be buried within other sources of noise within the larger scanning system. For the invention, it is more important to know within what "range band" a pitch error associated with a particular gap falls into, than to know what the pitch error actually is. As long as the manufacturing process for making the apparatus can reproducibly maintain the pitch error for all gaps 20 within a $\pm PE_{max}$ band, no image defect caused by pitch errors needs to be corrected.

To take a specific example, consider an array 100 for which it is determined, by whatever means, that the particular scanning system (such a system possibly including image-processing software as well as basic hardware) can tolerate a $PE_{max}=20$ micrometers. If the dicing and assembly technique used for the scanner produces an average pitch error $PE_{av}=\pm 5$ micrometers within an uncertainty range $\pm\Delta=\pm 10$ micrometers, no image correction is needed, since the value ($PE_{av}\pm\Delta$) falls within the $\pm PE_{max}$ a range.

If, instead, the dicing and assembly technique is capable only of producing $PE_{av}=50\pm 10$ micrometers, then image correction is needed. However, such an image correction does not need to bring the quality back to the PE=0 level; it only needs to bring the quality back up to the level corresponding to the range $-PE_{max}<0<+PE_{max}$. In other words, the image correction can be identical for all gaps 20 in a single scanning apparatus, regardless of the PE at each gap 20, as long as it is known that no gap 20 provides a $\Delta$ greater than $PE_{max}$.

In the event that the assembly and dicing technique by which a particular scanner is manufactured cannot, by itself, provide a $PE_{av}$ which is within an acceptable range, an image correction technique is applied to signals originating from photosensors 14 which are proximate to each gap 20. Within the context of the present invention, such an interpolation technique can be applied in an identical manner for all gaps 20 within an apparatus, regardless of the actual size of any particular gap 20. In contrast, many of the above-cited prior art techniques rely on measuring, memorizing, and compensating for the errors created by each particular gap 20.

In a general situation in the prior art, where $PE_{av}$ is a fraction of the regular intra-chip pitch, all of the outputs of a first chip 12 in the apparatus, such as chip 12*a* in FIG. 2, are left uncorrected. For a next chip in the apparatus, such as chip 12*b* in FIG. 2, the outputs thereof must be corrected (by interpolation, as defined above) to obtain a simulated output, calculated from the actual outputs of all photosensors of chip 12*b* and from some photosensors from chip 12*a*, that corresponds to chip 12*b* as if it had been displaced by a distance equal to the pitch error between chip 12*a* and 12*b*, which can be called $PE_{ab}$. In turn, the outputs from the photosensors of successive chips across the array must accumulate the previous pitch errors, so that for instance the outputs from the photosensors of chip 12*c* must be corrected for a pitch error $PE_{ab}+PE_{bc}$, and the photosensors of chip 12*d* must be corrected by $PE_{ab}+PE_{bc}+PE_{cd}$, etc., with all of these pitch errors having to be actually measured and memorized.

According to the present invention, if it is known in advance that all pitch errors are within a predetermined range $PE_{av}\pm\Delta$, where $PE_{av}$ is the average pitch error and $\Delta$ is the placement uncertainty in the manufacturing process, this measurement and retention of actual pitch errors need not occur. Rather, as long as $\Delta$ is less than or equal to $PE_{max}$, then a simple correction algorithm $PE_{ab}=PE_{bc}=PE_{cd}=PE_{n,n+1}=PE_{av}$ can be used. Thus, according to the present invention, the output of a photosensor 14 disposed on an Nth chip 12 along a main linear array is adjusted to effect a spatial displacement of a constant (for all chips 12) pitch error PE, times an integer (N−1) (understanding that the outputs from the first chip along the main linear array will not need any displacement; for purposes of the claims, a "first chip" can be any selected chip along an array, not necessarily an end chip within the scanner 100, with a chip N spaced therefrom).

Figure 4:
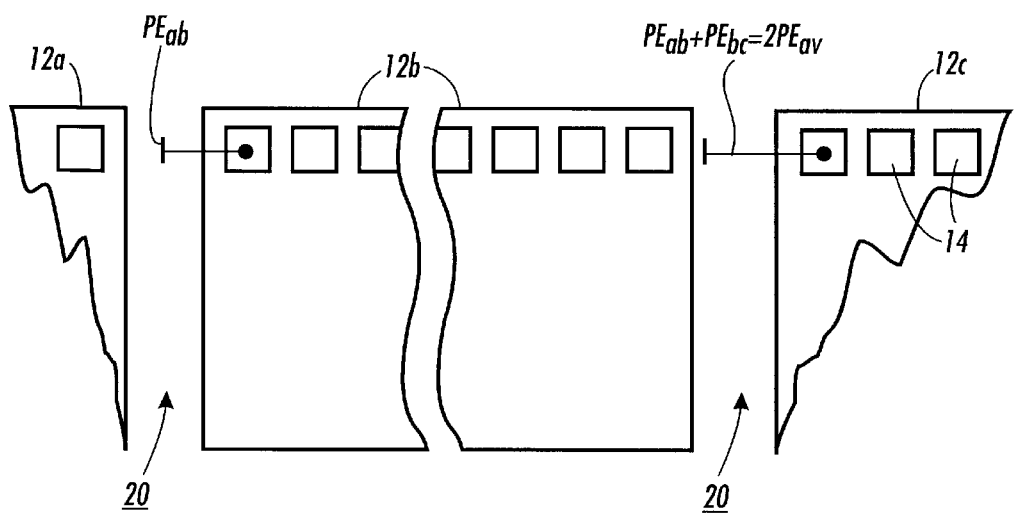
FIG. 4 is a plan view showing two gaps between adjacent chips, illustrating a principle according to the present invention.

An illustration of the principle underlying this aspect of the present invention is shown in FIG. 4. In the plan view of FIG. 4, there is shown on the left a first gap 20 between chips 12*a* and 12*b*, and, on the right, a second gap 20 between chips 12*b* and 12*c*. In order to compensate for the presence of gap 20 between chips 12*a* and 12*b*, the outputs of all the photosensors 14 on chip 12*b* will be interpolated (in this view) to the left by the same distance $PE_{ab}$. This interpolation and spatial shifting of all outputs across the chip 12*b* is done by applying the actual outputs of the photosensors 14 to an interpolation algorithm which may have as inputs the actual outputs of photosensors 14 on chips 12*a* and/or 12*b*, as needed.

With regard to the gap 20 between chip 12*b* and chip 12*c*, as mentioned above, the outputs associated with chip 12*c* are interpolated to be spatially displaced by a distance $PE_{ab}+PE_{bc}$, thus taking into account the gap between chips 12*a* and 12*b* as well. This interpolation is shown in FIG. 4, where all of the outputs from photosensors 14 on chip 12*c* are, through interpolation, spatially displaced by the same distance $PE_{ab}+PE_{bc}$. However, one advantage of the present invention is that the shifting distance for each chip is constant (and, in one embodiment, can be set to a known value of $PE_{av}$), so that $PE_{ab}+PE_{bc}=2PE_{av}$. Similarly, for a gap 20 between a chip 12*c* and 12*d*, the shifting distance is $PE_{ab}+PE_{bc}+PE_{cd}=3\, PE_{av}$ and so on for all chip gaps 20 for the entire length of the main linear array. According to the present invention, as long as $\Delta$ is smaller than or equal to $PE_{max}$, simply interpolating the outputs of each chip to effect a shift of a constant $PE_{av}$ distance, multiplied by an integer relating to the position of the chip within the main linear array is sufficient for overcoming image quality problems associated with unknown gap widths along the array. In the prior art, these chip gaps had to be measured and retained in memory; in the present invention facilitates achieving a similarly satisfactory result with a much simpler algorithm.

Another technique according to the present invention involves adding an extra, artificial output, of an interpolated "phantom photosensor" which would be disposed toward the gap 20, to the video stream from the chip (i.e., added in the sense that the artificial output is placed in the video stream as if the chip had an extra photosensor). This artificial value is in effect an output (which is not in fact output, but merely interpolated from the outputs of adjacent photosensors) which is disposed by a predetermined PE, such as of one pitch, from the end photosensor 14 of each chip toward gap 20. This artificial value is interpolated, such as by taking a weighted average of outputs from photosensors on either side of gap 20, such as on chips 12a and 12b. The artificial value is then added to the data stream associated with chip 12b; or, more broadly, associated with the whole array 100; addition of such artificial output values to the video stream can be done either by circuitry or software at each chip 14 itself, or by downstream image-processing software or hardware external to the array 100. This "phantom photosensor," in effect outputting the artificial output value, exists only in the fact that one artificial value per chip is added to the data stream and that the system automatically assumes that it is perfectly placed. As long as $\Delta<PE_{max}$, the error caused by this perfect placement assumption will not cause an objectionable defect by virtue of the definition of $PE_{max}$.

The advantage of simply adding the artificial output value, or in other words using the "phantom photosensor" on each chip, is that the calculated spatial displacement of outputs which is required with the FIG. 4 embodiment is not required. But for the additional output value of each chip, the actual outputs of each photosensor 14 on each chip 12 can be used by a larger image-processing system directly.

For an even simpler technique, instead of doing a formal weighted-average or other interpolation of the additional output value, the additional output value can simply be set equal to the output of the end photosensor 14 on each chip; at some resolutions this may be a reasonable assumption which has no noticeable effect on image quality. Alternately, the additional output value can be interpolated solely from outputs of multiple photosensors 14 on each chip 12, i.e., from photosensors on only one side of each gap 20.

What is claimed is:

1. A method of processing image data from a photosensitive imaging apparatus, the apparatus including a plurality of chips, each chip having a linear array of photosensors thereon, the photosensors on each chip being spaced by a predetermined pitch, each photosensor adapted to output a value related to light incident thereon, the chips being mounted with the linear arrays thereon arranged to form a main linear array, each pair of chips in the plurality of chips defining a gap therebetween, comprising the step of:

for a chip, interpolating the outputs of the photosensors therein to effect a spatial displacement of the outputs along the main linear array, the displacement being a product of a constant and an integer, the integer relating to a position of the chip along the main linear array wherein the constant is related to a maximum pitch error between a pair of chips in the apparatus, the maximum pitch error being the largest pitch error whereby any corresponding image defects will remain invisible in recorded images made with the a apparatus.

2. The method of claim 1, wherein the constant equals the maximum pitch error.

3. The method of claim 1, wherein the constant is related to an average pitch error associated with a manufacturing process.

4. The method of claim 1, wherein the integer is N−1, for an Nth chip along the main linear array.

5. The method of claim 1, wherein the constant equals one pitch.

* * * * *